(12) United States Patent
Jost et al.

(10) Patent No.: US 8,178,843 B2
(45) Date of Patent: May 15, 2012

(54) POLYCRYSTALLINE HETEROSTRUCTURE INFRARED DETECTOR

(75) Inventors: Steven R. Jost, Amherst, NH (US); Danny J. Reese, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1225 days.

(21) Appl. No.: 11/607,179

(22) Filed: Dec. 1, 2006

(65) Prior Publication Data

US 2011/0168996 A1 Jul. 14, 2011

Related U.S. Application Data

(60) Provisional application No. 60/741,425, filed on Dec. 1, 2005.

(51) Int. Cl.
*H01L 31/0368* (2006.01)
(52) U.S. Cl. .................................................. 250/338.4
(58) Field of Classification Search ............... 250/338.4
See application file for complete search history.

(56) References Cited

U.S. PATENT DOCUMENTS

| | | | | |
|---|---|---|---|---|
| 5,804,475 A * | 9/1998 | Meyer et al. | ................... | 438/172 |
| 5,823,682 A * | 10/1998 | Betz | ................... | 374/130 |
| 6,890,809 B2 * | 5/2005 | Karpov et al. | ................ | 438/200 |
| 7,608,830 B1 * | 10/2009 | Kinch | ................... | 250/370.06 |
| 7,696,584 B2 * | 4/2010 | Henning et al. | .............. | 257/411 |
| 7,741,147 B2 * | 6/2010 | Kiesel et al. | ................... | 438/104 |
| 2006/0021646 A1 * | 2/2006 | Yotsuhashi et al. | ........ | 136/236.1 |

OTHER PUBLICATIONS

Becker, Current and Future Trends in Infrared Focal Plane Array Technology, 2005, Proc. of SPIE, vol. 5881, 1-15.*
Ueta et al., IV-VI Compound heterostructures grown by molecular beam epitaxy, 2002, Microelectronics Journal 33, pp. 331-335.*

* cited by examiner

*Primary Examiner* — David Porta
*Assistant Examiner* — Djura Malevic
(74) *Attorney, Agent, or Firm* — Daniel J. Long; Robert K. Tendler

(57) ABSTRACT

A midwave infrared lead salt photodetector manufactured by a process comprising the step of employing molecular beam epitaxy (MBE) to grow a heterostructure photoconductive detector with a wide-gap surface layer that creates a surface channel for minority carriers.

9 Claims, 1 Drawing Sheet

POLYCRYSTALLINE HETEROSTRUCTURE INFRARED DETECTOR

RELATED APPLICATIONS

This Application claims rights under 35 USC §119(e) from U.S. Application Ser. No. 60/741,425 filed Dec. 1, 2005, entitled Polycrystalline Heterostructure Infrared Detector, the contents of which are incorporated herein by reference.

STATEMENT OF GOVERNMENT INTEREST

The invention was made with United States Government support under Contract No. S02-13. The United States Government has certain rights in this invention.

BACKGROUND OF THE INVENTION

1. Field of the Invention

The present invention relates to lead salt photodetectors and more particularly to midwave infrared lead salt photodetectors.

2. Brief Description of Prior Developments

The achievement of near-background limited (for 180 degree field of view) midwave infrared detector performance at room temperature mandates simultaneous responsivity (signal) and high impedance (for low-noise). Generally good responsivity is not compatible with high resistance and currently available room temperture photoconductive detectors often sacrifice response for high impedance due to the low mobility and lifetimes found in midwave semiconductors at these operating temperatures.

In the photodetector prior art air annealing of thin lead salt films and material compensation for impedance. The disadvantage of this procedure is that it may lead to surface damage and poor photoconductive gain.

There is, therefore, a need for improved photoconductors and methods of their manufacture that overcome the disadvantages of the prior art.

SUMMARY OF INVENTION

According to the present invention, molecular beam epitaxy (MBE) is employed to grow a heterostructure photoconductive detector with a wide-gap surface layer that creates a surface channel for minority carriers that enhances room temperature lifetimes by orders of magnitude over bulk polycrystalline material. This method is superior to the normal practice of surface oxidation as it provides more control over the surface potential and results in less damage to the semiconductor surface (and hence longer carrier lifetimes). This heterostructure results in a depletion layer that results in higher detector impedance without sacrifice of photoconductive gain.

BRIEF DESCRIPTION OF THE DRAWINGS

The present invention is further described with reference to the accompanying drawings wherein.

DETAILED DESCRIPTION OF THE PREFERRED EMBODIMENT

Figure 1:
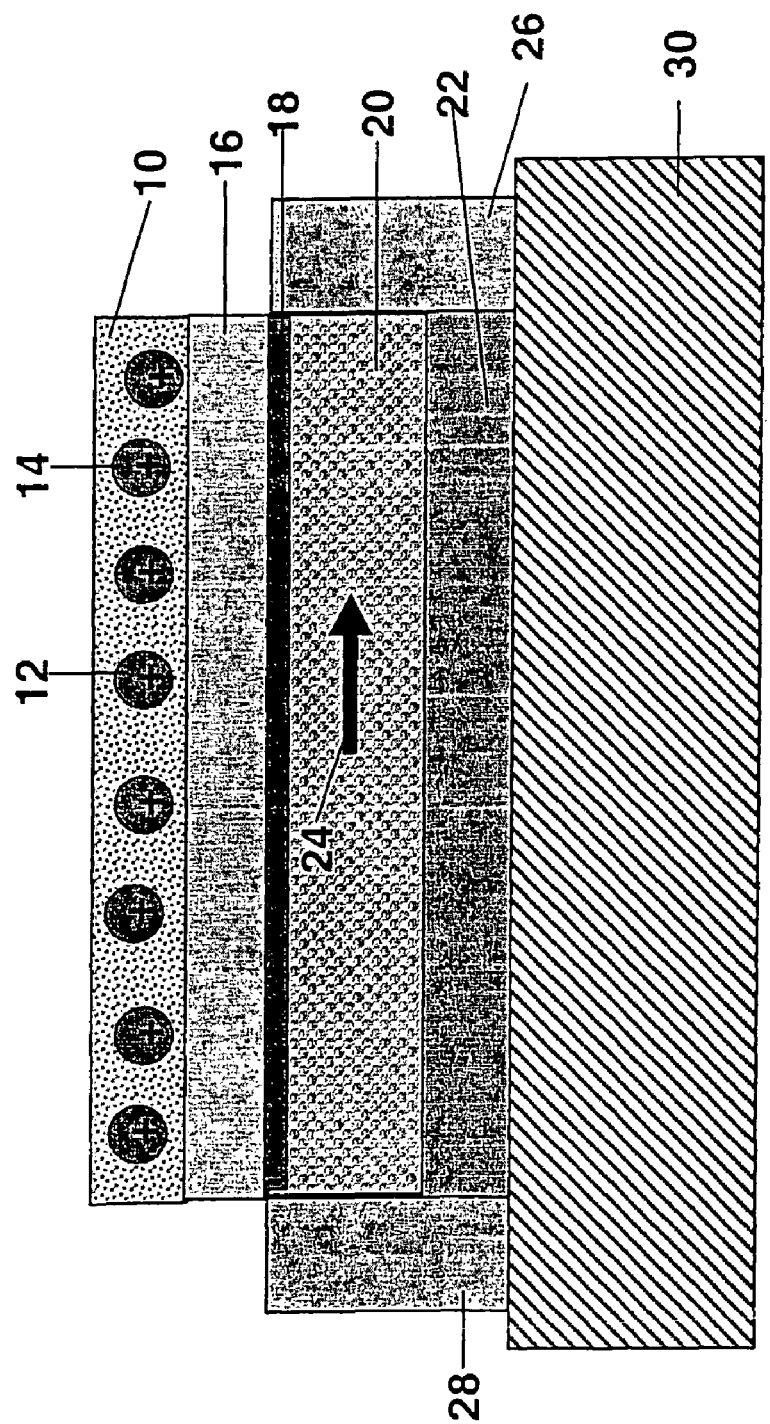
FIG. 1 is a vertical cross-section of a preferred embodiment of the photodetector of the present invention.

Referring to FIG. 1, the photodetector includes a surface oxide layer 10 with fixed positive charges as at 12 and 14. Beneath the surface oxide layer 10, there is a wide-gap cap 16, which is superimposed over a surface channel 18. Beneath the surface channel there is a depletion region 20 that is in the PbSe—(p-type) layer 22 and is depleted of majority carriers. There is a current flow 24 in the depletion region 20. The majority carrier current flow is in the PbSe that is not depleted. The channel 18 at the surface keeps the minority carriers from re-combining too quickly (lifetime enhancement). At the opposed ends of the depletion region 20 and the PbSe—(p-type) layer 22 there are metal contacts 26 and 28 which are attached to the PbSe. The entire described photoconductor is superimposed on a substrate 30. The minority carrier lifetime is enhanced at the surface due to exclusion of majority carriers by the built-in electric field.

Those skilled in the art will appreciate that the depletion region 20 is created by the fixed positive charge as at 12 and 14 in the surface oxide layer 10, and that minority carrier (electron) lifetime is enhanced in surface channel 18 so that the depletion field separates electron-hole pairs and draws electrons to the channel. The depleted layer yields lower dark current (sub-intrinsic carrier concentration).

It will also be appreciated that the heterostructure creates minority carrier channel at surface leading to enhanced photoconductive gain. Surface depletion increases device impedance and results in lower noise. These conditions are not mutually exclusive and result in improved detector sensitivity.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A high impedance low noise midwave infrared lead salt photodetector having enhanced photoconductive gain, comprising:
   a surface oxide layer;
   a wide-gap cap therebeneath;
   a surface channel beneath said wide-gap cap;
   a depletion region under said surface channel; and,
   a pair of horizontally spaced apart electrodes to either side of said depletion region to create a built-in electric field and current flow that are orthogonal to establish a horizontal surface flow, the built-in field separating carriers and enhancing lifetime, said photodetector having been formed using a molecular beam epitaxially grown heterostructure lead salt with a wide-gap surface layer that creates a surface channel for minority carriers on top of said depletion region, in which said horizontal current flows in the depletion region between said horizontally spaced-apart electrodes to produce photoconductive gain in the horizontal current flow, said surface channel reducing the speed at which the minority carriers recombine due to the exclusion of majority carriers by a built-in electric field such that room temperature lifetimes are enhanced as compared to a photodetector that includes a bulk polycrystalline material, the photo detector structure at the same time providing a high detector impedance, low noise output without sacrificing photo conductive gain.

2. The photoconductor of claim 1 wherein the photoconductor includes a surface oxide layer.

3. The photoconductor of claim 2 wherein the surface oxide layer has a plurality of fixed positive charges.

4. The photoconductor of claim 3 wherein the surface oxide layer is superimposed over a wide-gap cap.

5. The photoconductor of claim 4 wherein the wide-gap cap is superimposed over a surface channel.

6. The photoconductor of claim 5 surface channel is superimposed over a depletion region.

7. The photoconductor of claim 6 wherein the depletion region is a PbSe (p-type) layer.

8. The photoconductor of claim 7 wherein there is current in the depletion layer.

9. The photoconductor of claim 8 wherein metal contacts are attached to the PbSe (p-type) layer.

* * * * *